United States Patent
Futami et al.

(10) Patent No.: US 9,466,946 B2
(45) Date of Patent: Oct. 11, 2016

(54) SEMICONDUCTOR LASER ARRAY

(71) Applicant: Mitsubishi Electric Corporation, Tokyo (JP)

(72) Inventors: Mitsuaki Futami, Tokyo (JP); Yuki Hasegawa, Tokyo (JP); Toru Yoshihara, Tokyo (JP); Shinji Yagyu, Tokyo (JP); Tetsuya Nishimura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/562,163

(22) Filed: Dec. 5, 2014

(65) Prior Publication Data
US 2015/0222091 A1 Aug. 6, 2015

(30) Foreign Application Priority Data

Feb. 4, 2014 (JP) ................. 2014-019166

(51) Int. Cl.
*H01S 5/00* (2006.01)
*H01S 5/20* (2006.01)
*H01S 5/40* (2006.01)
*H01S 5/028* (2006.01)

(52) U.S. Cl.
CPC ............. *H01S 5/20* (2013.01); *H01S 5/0288* (2013.01); *H01S 5/4031* (2013.01)

(58) Field of Classification Search
CPC ........ H01S 5/026; H01S 5/0288; H01S 5/20; H01S 5/4031; H01S 5/00; B82Y 20/00
USPC ............................ 372/50.12, 50.121, 50.122
See application file for complete search history.

(56) References Cited

U.S. PATENT DOCUMENTS

| 5,185,290 | A | * | 2/1993 | Aoyagi | H01L 33/44 148/DIG. 95 |
| 5,228,050 | A | * | 7/1993 | LaCourse | H01S 5/4031 372/23 |
| 5,953,359 | A | * | 9/1999 | Yamaguchi | H01S 5/0265 372/23 |
| 6,459,714 | B1 | * | 10/2002 | Narui | H01S 5/4031 372/43.01 |
| 6,646,975 | B1 | | 11/2003 | Uchizaki et al. | |
| 2004/0062285 | A1 | | 4/2004 | Uchizaki et al. | |

(Continued)

FOREIGN PATENT DOCUMENTS

| JP | 61-116891 A | 6/1986 |
| JP | 62-234388 A | 10/1987 |

(Continued)

*Primary Examiner* — Tuan Nguyen
(74) *Attorney, Agent, or Firm* — Birch, Stewart, Kolasch & Birch, LLP

(57) ABSTRACT

In a semiconductor laser array of the present invention, a plurality of laser elements (first to fifth laser elements) are disposed such that waveguides of the laser elements are parallel to one another, each of the plurality of laser elements includes a front-end-surface reflection film on a front end surface serving as a light emitting surface of the waveguide, each of the plurality of laser elements includes a rear-end-surface reflection film on a rear end surface opposite to the front end surface with the waveguide sandwiched between the front end surface and the rear end surface, the front-end-surface reflection films of at least two of the plurality of laser elements have different reflectances, the rear-end-surface reflection films of the plurality of laser elements have the same reflectance, and the plurality of laser elements are driven by a single power supply.

8 Claims, 5 Drawing Sheets

(56) References Cited

U.S. PATENT DOCUMENTS

| | | | | |
|---|---|---|---|---|
| 2004/0196877 A1* | 10/2004 | Kawakami | ............ | B82Y 20/00 372/23 |
| 2005/0169335 A1* | 8/2005 | Gao | ............ | H01S 5/1082 372/49.01 |
| 2005/0254539 A1* | 11/2005 | Klimek | ............ | G02B 6/102 372/50.12 |
| 2009/0086782 A1 | 4/2009 | Yokoyama et al. | | |
| 2010/0238784 A1 | 9/2010 | Takahashi | | |

FOREIGN PATENT DOCUMENTS

| | | |
|---|---|---|
| JP | 2000-11417 A | 1/2000 |
| JP | 2008-4743 A | 1/2008 |

\* cited by examiner

SEMICONDUCTOR LASER ARRAY

BACKGROUND OF THE INVENTION

1. Field of the Invention

The present invention relates to a semiconductor laser array and more particularly to a multi-wavelength semiconductor laser array.

2. Description of the Background Art

Solid state light sources (for example, an LED, a semiconductor laser, and an organic EL) make use of advantages such as high efficiency and long life, so that a wide range of their use has been developed. They are becoming to serve as light sources in place of the existing lamps, particularly in lighting devices and display devices. Among the solid state light sources, the semiconductor laser has high light-emitting efficiency and high compatibility with a projector, thereby being greatly expected to be as a next-generation light source.

On the other hand, a problem occurring upon the use of the semiconductor laser as the light source of the display device is a speckle noise. The speckle noise is a screen glare and caused by high coherence of the semiconductor laser. In particular, the screen glare seriously impairs video quality of the display device, so that measures to suppress the speckle noise are necessary. The measures can be taken to suppress the speckle noise in each step of a screen, an optical system in the display device, and the light source.

First, as the measure in the screen, the screen itself is vibrated to reduce the speckle noise. However, the mechanism is massive, so that it is unrealistic to apply it to a transportable projector in which the place of use is not limited. Moreover, as the measure in the optical system, the technique to insert a diffusion plate in an optical path has been known. This can reduce the speckle noise with the simple mechanism while light is greatly lost in the diffusion plate, so that more efficient measures are desired.

As the measure in the light source, the speckle noise can be reduced by increasing a spectral width of the semiconductor laser. This can be achieved by multiplexing wavelengths of the semiconductor laser having a narrow spectral width. As described above, the measures against the speckle noise in the screen and the optical system have many challenges, so that it is preferable to take measures in the light source.

As a technique to multiplex the wavelengths of the semiconductor laser, a plurality of semiconductor laser light sources that emit light beams having different wavelengths are prepared, and a projector is configured such that the same screen is irradiated with the light beams simultaneously. However, while this technique can easily obtain the effect of the speckle noise reduction, the mechanism becomes complicated and also the manufacturing cost is greatly constrained due to the requirement for the plurality of laser light source devices.

As the technique to solve this, a multi-wavelength semiconductor laser array emits light beams having a plurality of wavelengths in one semiconductor laser light source device. The semiconductor laser array includes a plurality of semiconductor laser elements in parallel, the semiconductor laser element being formed of a waveguide and a pair of reflection mirrors (namely, front end surface and rear end surface) sandwiching the waveguide. The multi-wavelength semiconductor laser array is a light source device in which the plurality of laser elements forming the semiconductor laser array emit light beams having different wavelengths from each other.

A monolithic semiconductor laser array is known as the multi-wavelength semiconductor laser array. For example, the monolithic semiconductor laser array disclosed in Japanese Patent Application Laid-Open No. 2000-11417 is the multi-wavelength semiconductor laser array including a first laser element having AlGaAs as an active layer and a second laser element having InGap as an active layer formed on the same GaAs substrate. This configuration enables the first and second laser elements to emit the light beams having the different wavelengths suitable for the composition of each active layer. In this manner, more than two different compositions of the active layers are formed on the same semiconductor substrate, which can achieve the multi-wavelength semiconductor laser.

Moreover, in the multi-wavelength semiconductor laser array disclosed in Japanese Patent Application Laid-Open No. 2008-4743, each waveguide of the semiconductor laser array is arranged densely in the central part of the array and sparsely in both ends to generate a temperature distribution in the array, to thereby multiplex the wavelengths. In other words, the laser elements as the heat source arranged densely in the central part of the array oscillates closer to the long-wavelength side than the laser elements at the end part of the array because a wavelength shift amount increases according to a temperature rise in the central part. In general, the semiconductor laser is known that as the temperature of the waveguide increases, the wavelength is shifted to the long-wavelength side.

However, to form the active layers having the different compositions on the same semiconductor substrate as disclosed in Japanese Patent Application Laid-Open No. 2000-11417, a complicated manufacturing method accompanied by the plurality of semiconductor crystal growth is needed. The complicated manufacturing method not only increases the number of steps but also causes quality degradation of the semiconductor crystals, which leads to impairment of productivity and reliability of the product.

Moreover, in the multi-wavelength laser array of Japanese Patent Application Laid-Open No. 2008-4743, the waveguides in the central part of the array are extremely densely arranged to generate the temperature distribution. Thus, when the semiconductor laser having a wide stripe and producing high output is formed, mutual optical interference occurs between the adjacent waveguides, which may result in an unstable operation of the laser.

SUMMARY OF THE INVENTION

It is an object of the present invention to provide a semiconductor laser array that has a simple configuration and is capable of reducing a speckle noise.

In a semiconductor laser array of the present invention including a plurality of laser elements, the plurality of laser elements are disposed such that waveguides of the laser elements are parallel to one another, each of the plurality of laser elements includes a front-end-surface reflection film on a front end surface serving as a light emitting surface of the waveguide, each of the plurality of laser elements includes a rear-end-surface reflection film on a rear end surface opposite to the front end surface with the waveguide sandwiched between the front end surface and the rear end surface, the front-end-surface reflection films of at least two of the plurality of laser elements have different reflectances, the rear-end-surface reflection films of the plurality of laser elements have the same reflectance, and the plurality of laser elements are driven by a single power supply.

The simple configuration in which the plurality of laser elements include the front-end-surface reflection films of the different reflectances multiplexes the wavelengths of the semiconductor laser array, whereby the speckle noise can be reduced. The reflectances of the front-end-surface reflection films can be easily adjusted with accuracy, so that the semiconductor laser array having the multiplexed wavelengths can be easily manufactured.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Configuration

Figure 1:
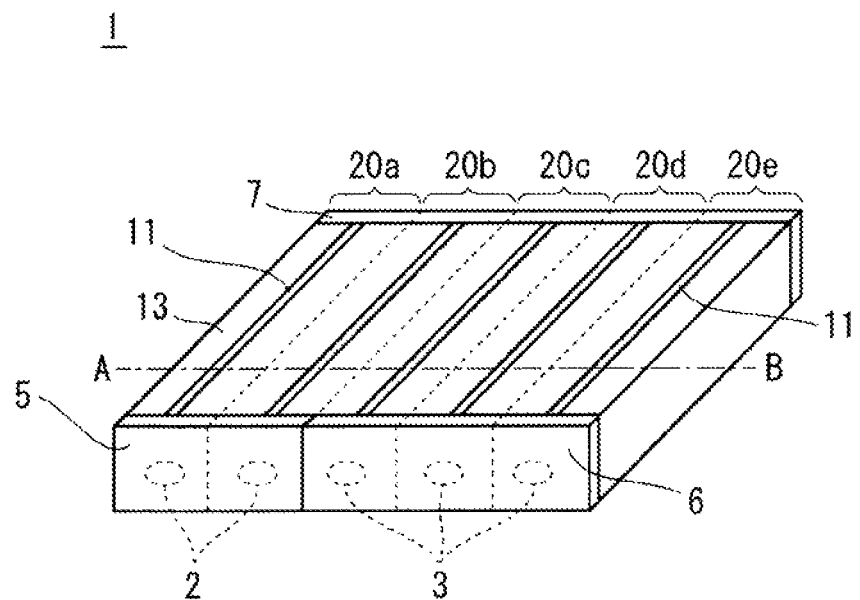
FIG. 1 is a perspective view of a semiconductor laser array according to a first preferred embodiment.
Figure 2:
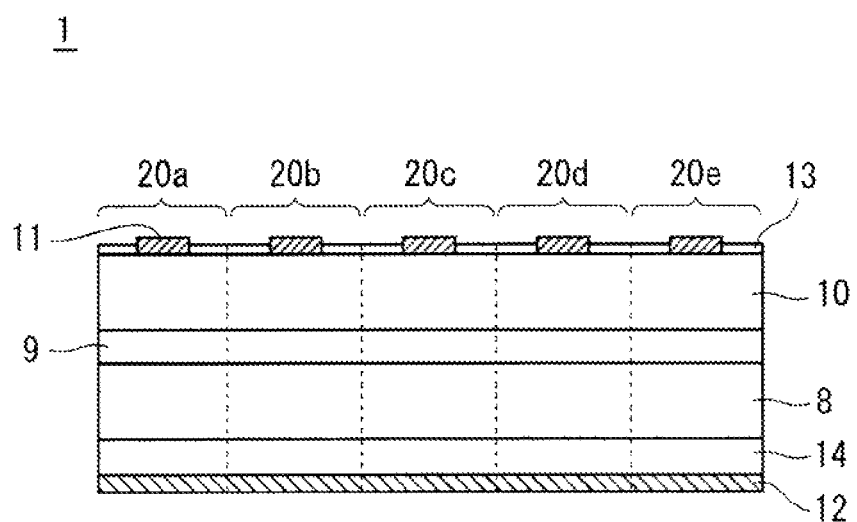
FIG. 2 is a cross-sectional view of the semiconductor laser array according to the first preferred embodiment.

FIG. 1 is a perspective view of a semiconductor laser array 1 in this preferred embodiment. FIG. 2 is a cross-sectional view of the semiconductor laser array 1 in this preferred embodiment (taken along an AB line of FIG. 1). As shown in FIG. 1, the semiconductor laser array 1 of the preferred embodiment includes a plurality of laser elements (namely, first to fifth laser elements 20a, 20b, 20c, 20d, 20e). The first to fifth laser elements are arranged in an array. Arranging them in the array refers to the manner that waveguides (not shown) in the adjacent laser elements are parallel to one another.

The first laser element 20a includes a front-end-surface reflection film 5 on a front end surface serving as a light emitting surface of the waveguide. Moreover, the first laser element 20a includes a rear-end-surface reflection film 7 on a rear end surface opposite to the front end surface with the waveguide sandwiched between the front end surface and the rear end surface. A laser beam is emitted from a light emitting point 2 of the front-end-surface reflection film 5. In other words, the first laser element 20a has a structure of a unit resonator including the reflection films at both the ends of the waveguide. The second laser element 20b is also configured similarly.

The third laser element 20c includes a front-end-surface reflection film 6 on a front end surface serving as a light emitting surface of a waveguide (not shown). Moreover, the third laser element 20c includes the rear-end-surface reflection film 7 on a rear end surface opposite to the front end surface with the waveguide sandwiched between the front end surface and the rear end surface. A laser beam is emitted from a light emitting point 3 of the front-end-surface reflection film 6. In other words, the third laser element 20c has a structure of a unit resonator including the reflection films at both the ends of the waveguide. The fourth laser element 20d and the fifth laser element 20e are also configured similarly.

As shown in FIG. 1, the semiconductor laser array 1 has a structure in which the plurality of light emitting points 2 and 3 are aligned. The first to fifth laser elements 20a, 20b, 20c, 20d, 20e do not have physical boundaries therebetween, so that FIGS. 1 and 2 show the area corresponding to each of the laser elements separated by broken lines for the sake of convenience.

The front-end-surface reflection films 5, the front-end-surface reflection films 6, and the rear-end-surface reflection films 7 are dielectric multilayer films for protecting the end surfaces of the waveguides and controlling reflectances. The rear-end-surface reflection films 7 have the reflectance higher than that of the front-end-surface reflection films 5 and 6. The technology to make a reflectance of front-end-surface reflection films different from a reflectance of rear-end-surface reflection films in a semiconductor laser array for the purpose of high output operation of a light source is generally known.

Furthermore, in the semiconductor laser array 1 of this preferred embodiment, the front-end-surface reflection films 5 of the first and second laser elements 20a, 20b and the front-end-surface reflection films 6 of the third to fifth laser elements 20c, 20d, 20e have different reflectances. In the preferred embodiment, if the value of the reflectance of the front-end-surface reflection films 5 is $R_5$ and the value of the reflectance of the front-end-surface reflection films 6 is $R_6$, the relationship $R_5 > R_6$ holds true. $R_5$ is, for example, 30%, and $R_6$ is, for example, 3%.

Figure 3:
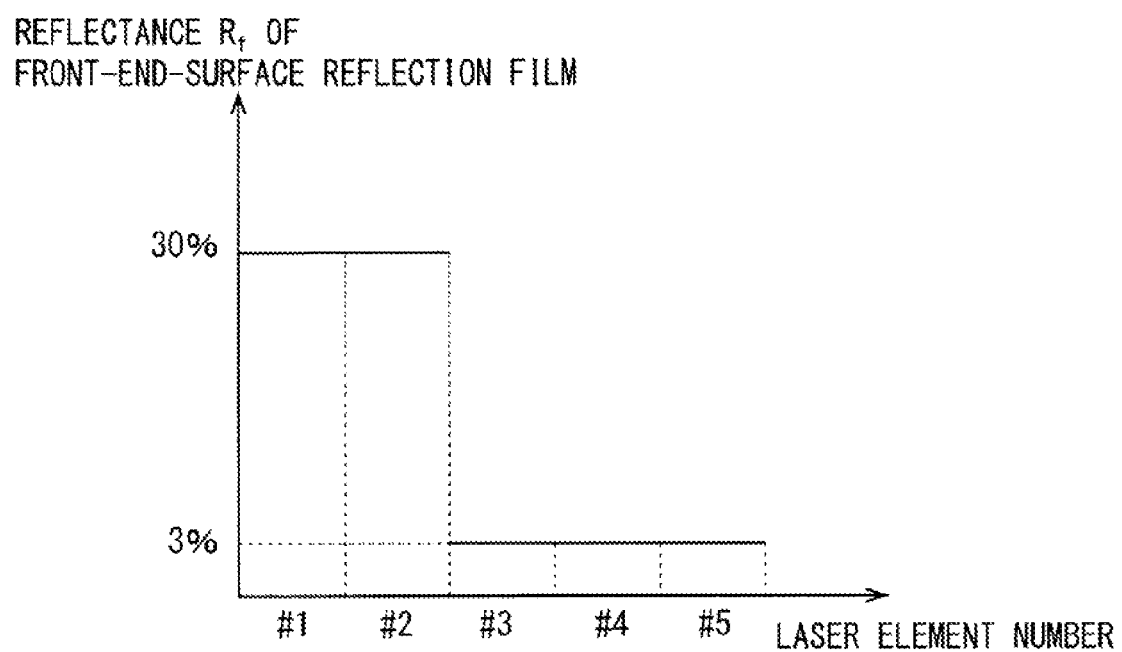
FIG. 3 is a diagram showing a reflectance distribution of front-end-surface reflection films of the semiconductor laser array according to the first preferred embodiment.

FIG. 3 is a diagram showing a reflectance distribution of the front-end-surface reflection films 5, 6 of the semiconductor laser array 1 in this preferred embodiment. As shown in FIG. 3, the front-end-surface reflection films 5 of the first and second laser elements 20a, 20b have the reflectance of 30% and the front-end-surface reflection films 6 of the third to fifth laser elements 20c, 20d, 20e have the reflectance of 3%. The reflectances of the front-end-surface reflection films 5 and 6 are set at such values, whereby the effect of the speckle noise reduction can be obtained.

As shown in FIG. 2, each laser element of the semiconductor laser array 1 is a broad area laser. A lower cladding layer 8, an active layer 9, and an upper cladding layer 10 are laminated in the stated order on a substrate 14 (for example, GaAs substrate). A lower electrode 12 is provided on a lower surface of the substrate 14. Upper electrodes 11 are provided on an upper surface of the upper cladding layer 10. Insulating films 13 are formed between the upper electrodes 11.

The broad area laser generally has a simple structure as shown in FIG. 2, and it is characterized in that it enables high output in proportion to a width of the upper electrode 11. The insulating films 13 are made of $SiO_2$ or the like and deposited for the purpose of confining an injected current, preventing a leak current, and protecting a surface of the semiconductor.

<Manufacturing Method>

A method for manufacturing the semiconductor array 1 will be described. First, the lower cladding layer 8, the active layer 9, and the upper cladding layer 10 are formed on the substrate 14 in which an initial growth occurs by a metal organic chemical vapor deposition method (MOCVD method) or the like. Next, waveguide patterns corresponding to the waveguides of the first to fifth laser elements 20a, 20b, 20c, 20d, 20e are formed by photolithography. The waveguide patterns are evenly spaced apart from one another. Moreover, the adjacent waveguide patterns are provided with a distance that does not cause mutual optical interference. Then, the insulating films 13 and the upper electrodes 11 are formed. The method for manufacturing the general broad area laser includes these steps described above.

Figure 4A:
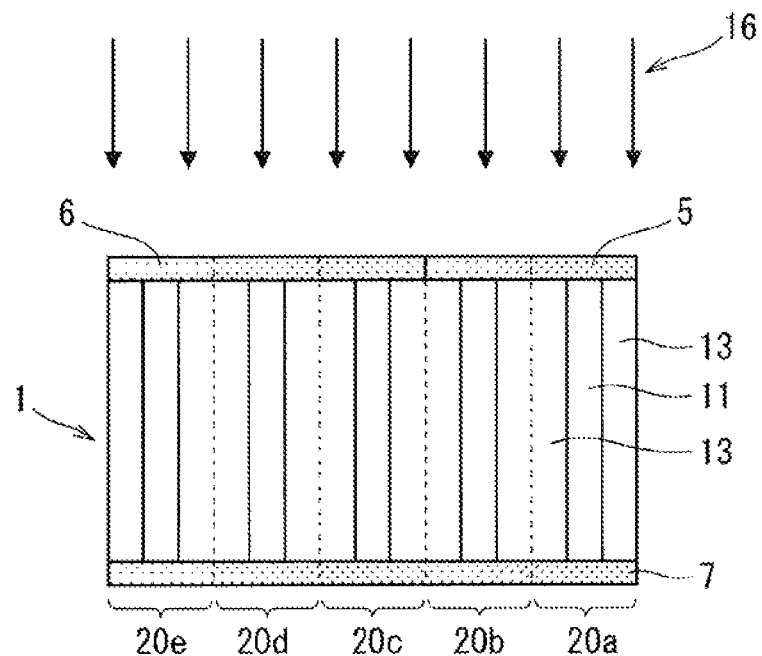
FIGS. 4A and 4B are diagrams showing a method for manufacturing the semiconductor laser array according to the first preferred embodiment.

Next, a method for forming the front-end-surface reflection films 5 and the front-end-surface reflection films 6 will be described. The formation of the front-end-surface reflection films 5, 6 includes a first vapor deposition step and a second vapor deposition step. First, in the first vapor deposition step, the front end surfaces of the first to fifth laser elements 20a, 20b, 20c, 20d, 20e are uniformly irradiated with a vapor deposition beam 16. The irradiation continues until the time when the front-end-surface reflection films 6 of the third to fifth laser elements 20c, 20d, 20e have the thickness which can obtain the desirable reflectance (for example, 3%). As a result, a dielectric multilayer film (3% of reflectance) is uniformly formed on the front end surface of each laser element. FIG. 4A is a top view of the semiconductor laser array 1 in the first vapor deposition step. In the first vapor deposition step, the dielectric multilayer film having the uniform thickness is formed, so that the front-end-surface reflection films 5 and the front-end-surface reflection films 6 have the same thickness.

Figure 4B:
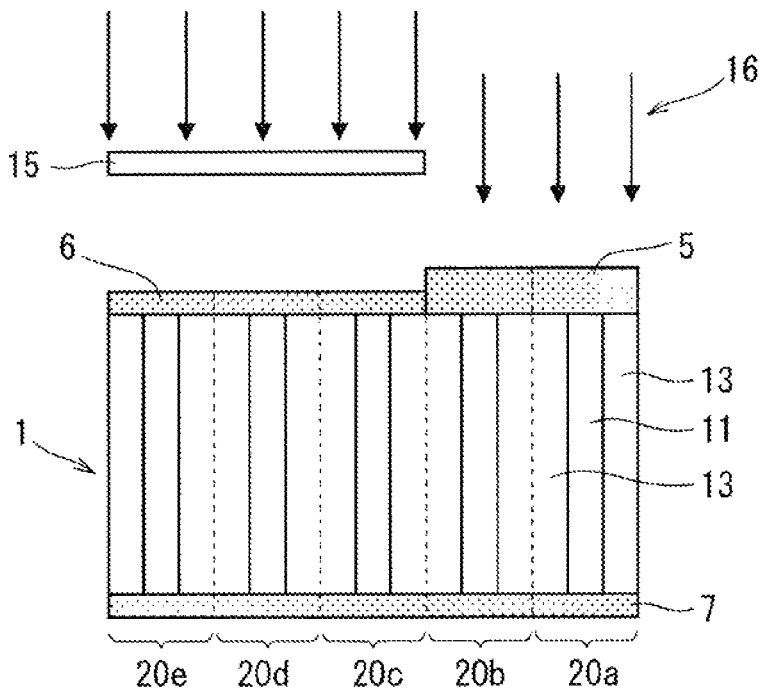

Next, the second vapor deposition step is performed. FIG. 4B is a top view of the semiconductor laser array 1 in the second vapor deposition step. In the second vapor deposition step, the front-end-surface reflection films 6 of the third to fifth laser elements 20c, 20d, 20e in a state of being covered with a shielding mask 15 are irradiated with the vapor deposition beam 16. The irradiation continues until the time when the front-end-surface reflection films 5 of the first and second laser elements 20a, 20b have the thickness which can obtain the desirable reflectance (for example, 30%). In the second vapor deposition step, the shielding mask 15 partially blocks the vapor deposition beam 16, so that the dielectric multilayer film is not deposited on the front-end-surface reflection films 6.

As a result of the first and second vapor deposition steps, the reflectance varies between the front-end-surface reflection films 5 of the first and second laser elements 20a, 20b (30% of reflectance) and the front-end-surface reflection films 6 of the third to fifth laser elements 20c, 20d, 20e (3% of reflectance).

A vapor deposition source which is a generation source of the vapor deposition beam 16 is omitted from FIGS. 4A and 4B. Moreover, the rear end surface of each laser element is irradiated with the vapor deposition beam until the time when its thickness can obtain the desirable reflectance (for example, 95%), and thus the dielectric multilayer film is uniformly deposited to form the rear-end-surface reflection films 7.

<Operation>

For the sake of clear description, the first and second laser elements 20a, 20b are a first group, and the third to fifth laser elements 20c, 20d, 20e are a second group as follows. In the semiconductor laser array 1 of the preferred embodiment, the front-end-surface reflection films 5 of the semiconductor elements of the first group and the front-end-surface reflection films 6 of the semiconductor elements of the second group have the different reflectances to emit light beams having different wavelengths from each of the front end surfaces. Moreover, the number of laser elements is different between the first group and the second group to uniformly output the light beams having the different wavelengths. The principle will be described below in detail.

As described above, the semiconductor laser array 1 has a structure in which the laser elements of the first group and the laser elements of the second group are parallel to one another. Thus, when each of the laser elements is driven under the same condition, a difference is generated in an oscillation threshold value between the laser elements of the first group and the laser elements of the second group. This can be seen from a threshold gain $g_{th}$ (unit [cm$^{-1}$]) of the laser which is generally expressed by the following expression.

$$\Gamma g_{th} = \alpha_i + \frac{1}{2L} \log \frac{1}{R_f R_r} \qquad \text{[Math 1]}$$

In the expression (1), $\Gamma$ is an optical confinement factor of a waveguide, $\alpha_i$ is a waveguide loss (unit [cm$^{-1}$]), L is a resonator length of the waveguide (unit [µm$^{-1}$]), and $R_f$ and $R_r$ are reflectances of the front-end-surface reflection films 5, 6 of the laser elements and of the rear-end-surface reflection films 7 of the laser elements, respectively. The second term on the right side of the expression (1) corresponds to a mirror loss $\alpha_m$ of the waveguide (unit [cm$^{-1}$]). Here, in the semiconductor laser array 1, each laser element has the same waveguide structure, so that each laser element is equal in the optical confinement factor $\Gamma$ as a parameter dependent on the waveguide structure, the waveguide loss $\alpha_i$, and the resonator length L. Moreover, the rear-end-surface reflection film 7 of each laser element has the same reflectance $R_r$. In other words, only the reflectance $R_f$ of the front-end-surface reflection films 5, 6 is different between the laser elements of the first group and the laser elements of the second group. Therefore, the threshold gain $g_{th}$ of the laser elements is a different value between the first group and the second group. The different threshold gain $g_{th}$ is equivalent to the different oscillation threshold value $I_{th}$ (unit [A]).

Here, considering that the reflectance $R_5$ of the front-end-surface reflection films 5 is higher than the reflectance $R_6$ of the front-end-surface reflection films 6 ($R_5 > R_6$), the expression (1) gives that the threshold gain $g_{th}$ of the laser elements of the first group is lower than the threshold gain $g_{th}$ of the laser elements of the second group. Therefore, the oscillation threshold value of the laser elements of the first group (referred to as $I_5$) is lower than the oscillation threshold value of the laser elements of the second group (referred to as $I_6$). Thus, the relationship $I_5 < I_6$ holds true.

Figure 5:
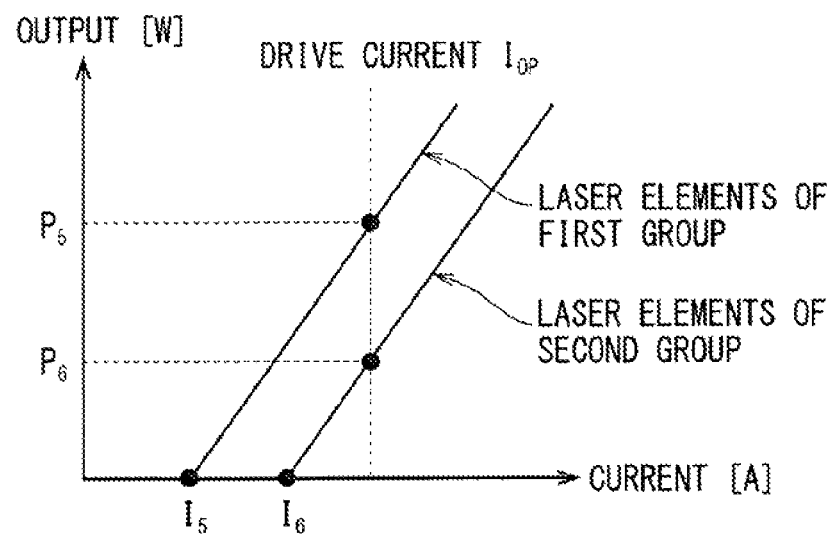
FIG. 5 is a diagram showing a relationship between a current and an output of laser elements.

Here, without considering an influence of a change in the reflectance on an output efficiency, the relationship between a current and an output of the laser elements of the first and second groups is shown in FIG. 5.

Note that each laser element (20a, 20b, 20c, 20d, 20e) of the semiconductor laser array 1 is driven under the same condition. This can be easily achieved by the drive of a single power supply as long as the waveguide of each laser element has the same structure, namely, the same resistance. Therefore, if a drive current $I_{op}$ (unit [A]) is given as a condition for driving each laser element, an output $P_5$ (unit

[W]) of the laser elements of the first group becomes higher than an output $P_6$ of the laser elements of the second group as shown in FIG. 5 ($P_5>P_6$).

A heating value $\Delta T$ (unit [K]) of the waveguide of each laser element in the semiconductor laser array 1 is expressed by the following expression (2).

$$\Delta T = (I_{op} \cdot V_{op} - P) \cdot R_{th} \qquad [\text{Math 2}]$$

Here, $V_{op}$ (unit [V]) is a drive voltage, and $R_{th}$ (unit [K/W]) is a heat resistance of the waveguide. Each laser element has the same drive condition (namely, $I_{op}$ and $V_{op}$) and the same heat resistance $R_{th}$, so that only the output P on the right side of the expression (2) changes, the output P being dependent on the reflectances of the front-end-surface reflection films 5 and 6. Therefore, the laser elements of the first group and the laser elements of the second group have the different heating value $\Delta T$ corresponding to the output P. In other words, a heating value $\Delta T_5$ of the laser elements of the first group is lower than a heating value $\Delta T_6$ of the laser elements of the second group ($\Delta T_5 < \Delta T_6$).

It is known that an oscillation wavelength of the laser element is shifted according to the heating value $\Delta T$ of the waveguide. The degree of the shifted wavelength is generally about 0.2 nm/K in red light and 0.05 nm/K in blue light.

In other words, if a distribution is given to the reflectance of the front-end-surface reflection films 5, 6 of each laser element forming the semiconductor laser array 1, a distribution occurs in the wavelength shift amount of the output light beams. This enables to output the laser beams having the different wavelengths between the laser elements of the first group and the laser elements of the second group. The wavelength shift amount $\Delta\lambda_5$ of the laser elements of the first group is $0.2 \times \Delta T_5$ when the laser beam is red. The wavelength shift amount $\Delta\lambda_6$ of the laser elements of the second group is $0.2 \times \Delta T_6$ when the laser beam is red. Here, since the relationship $\Delta T_5 < \Delta T_6$ holds true as described above, the relationship $\Delta\lambda_5 < \Delta\lambda_6$ holds true.

The principle as described above makes the reflectance of the front-end-surface reflection films 5 of the semiconductor laser array 1 from that of the front-end-surface reflection films 6, which enables to multiplex the wavelengths of the output light beams of the semiconductor laser array 1. This can also reduce the speckle noise.

Figure 6:
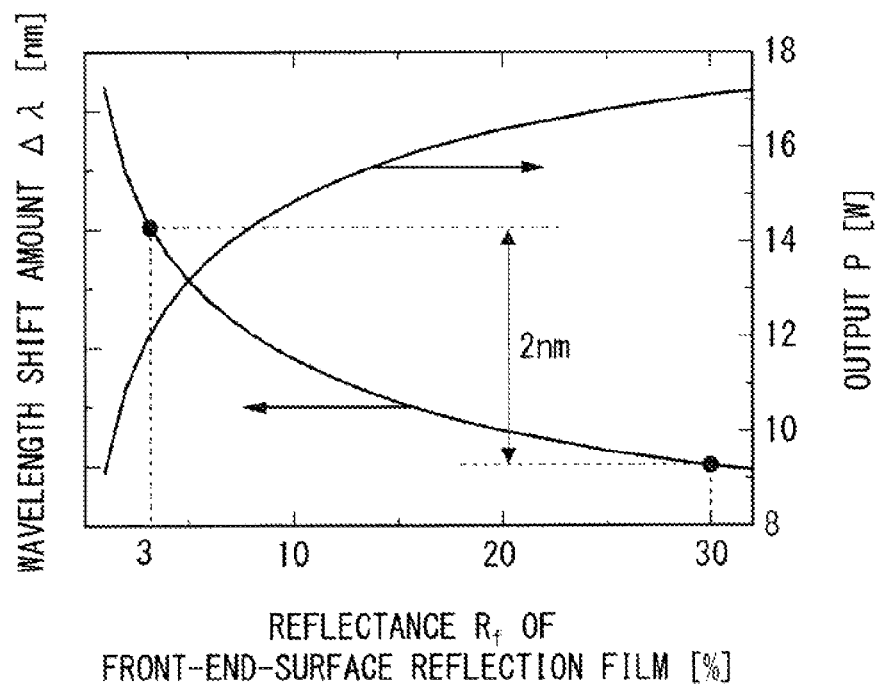
FIG. 6 is a diagram showing a reflectance dependence of front-end-surface reflection films on an output and a wavelength shift amount of laser elements.

The amount of dispersion of the output P (namely, the amount of dispersion of the heating value $\Delta T$) between ones of laser element as shown in FIG. 6 is actually influenced by various factors. The main factor is an influence on the output efficiency due to the change in the reflectance.

First, an increase in the reflectance enhances the output efficiency because of a reduction in the waveguide loss. As described above, as the reflectance increases, the oscillation threshold value decreases. This reduces a free carrier density in the waveguide, which results in suppression of absorption of light.

On the other hand, the increase in the reflectance decreases the output efficiency because of a reduction in the mirror loss. A loss of the laser beams in the mirror (namely, resonance end surface) is generally emitted as the output light beams to the outside of the resonator. Therefore, the high reflectance means that the light is hardly emitted to the outside. This is equivalent to the reduction in the output efficiency.

As described above, the output efficiency changes according to the reflectance of the front-end-surface reflection films 5, 6, and thus it is actually difficult to make the outputs from the laser elements of the first and second groups in parallel to each other as shown in FIG. 5. However, the appropriate setting of the drive current $I_{op}$ can distribute the outputs of the laser elements of the first and second groups, and thus the difference in the heating value of the waveguides between the laser elements of the first and second groups can be adjusted.

FIG. 6 is a diagram showing a reflectance dependence of the front-end-surface reflection films 5, 6 on the output P and the wavelength shift amount $\Delta\lambda$ of the laser elements. The horizontal axis of FIG. 6 shows the reflectance $R_f$ of the front-end-surface reflection films 5, 6. The vertical axes of FIG. 6 each show the wavelength shift amount $\Delta\lambda$ and the output P. In FIG. 6, the rear-end-surface reflection films 7 constantly have the reflectance $R_r$ of 95%. FIG. 6 is an example showing the influence of the change in the reflectance $R_f$ of the front end surfaces on the wavelength shift amount $\Delta\lambda$ and the output P.

It can be seen from FIG. 6 that when the front-end-surface reflection films 5 of the laser elements of the first group have the reflectance ($R_5$) of 30% and the front-end-surface reflection films 6 of the laser elements of the second group have the reflectance ($R_6$) of 3%, the difference in the wavelength shift amount $\Delta\lambda$ is approximately 2 nm. The output light beams of the semiconductor laser array 1 have the spectral width of 2 nm, which can place expectations on the sufficient effect of the speckle noise reduction.

On the other hand, as shown in FIG. 6, the output of the laser elements greatly fluctuates with the change in the reflectance of the front-end-surface reflection films 5, 6. As shown in FIG. 6, as the reflectance $R_f$ increases, the output P increases.

As with the preferred embodiment, in a case of multiplexing the wavelengths of the semiconductor laser array 1 to reduce the speckle noise, the output values of the light beams having the different wavelengths are preferably close to each other. Thus, in the semiconductor laser array 1 of the preferred embodiment, the laser elements of the first group are fewer than the laser elements of the second group.

In other words, in the preferred embodiment, the first and second laser elements 20a, 20b including the front-end-surface reflection films 5 having the relatively high reflectance (namely, laser elements producing high output) are fewer than the third to fifth laser elements 20c, 20d, 20e including the front-end-surface reflection films 6 having the relatively low reflectance (namely, laser elements producing low output). This enables to bring the two outputs of the output light beams having the different wavelengths close to each other.

In the semiconductor laser array 1 shown in FIG. 1 of the preferred embodiment, the two laser elements (first and second laser elements 20a, 20b) include the front-end-surface reflection films 5 having the relatively high reflectance (for example, 30%) and the three laser elements (third to fifth laser elements 20c, 20d, 20e) include the front-end-surface reflection films 6 having the relatively low reflectance (for example, 3%), to thereby uniformalize the outputs between the output light beams having the different wavelengths.

<Effects>

The semiconductor laser array 1 of the preferred embodiment including the plurality of laser elements (namely, first to fifth laser elements 20a, 20b, 20c, 20d, 20e) is characterized as follows. The plurality of laser elements are disposed such that the waveguides of the laser elements are parallel to one another. Each of the plurality of laser elements includes the front-end-surface reflection film 5, 6 on the front end surface serving as the light emitting surface of the waveguide. Each of the plurality of laser elements includes the rear-end-surface reflection film 7 on the rear end surface opposite to the front end surface with the waveguide sandwiched between the front end surface and the rear end surface. The front-end-surface reflection films 5, 6 of at least two of the plurality of laser elements have different reflectances. The rear-end-surface reflection films 7 of the plurality of laser elements have the same reflectance. The plurality of laser elements are driven by a single power supply.

Therefore, the semiconductor laser array 1 of the preferred embodiment has the simple structure in which the front end surface reflectance films 5 and 6 of the plurality of laser elements have the different reflectances, which allows for the speckle noise reduction by multiplexing the wavelengths of the semiconductor laser array 1. The reflectance of the front-end-surface reflection films 5, 6 can be easily adjusted with accuracy, so that the semiconductor laser array 1 can be easily obtained.

The technique to multiplex the wavelengths of the semiconductor laser array 1 by changing the reflectance of the front-end-surface reflection films can be applied to the broad area laser having one of the simplest structures as the laser element. In other words, the broad area laser is adopted as the structure of the laser element, which enables to multiplex the wavelengths of the semiconductor laser array easily.

Furthermore, the semiconductor laser array 1 of the preferred embodiment can multiplex the wavelengths by making the reflectance of the front-end-surface reflection films 5, 6 of the plurality of laser elements having the same structure different from each other, and this eliminates the need to change the internal structure of the semiconductor laser array for multiplexing the wavelengths. In other words, the process of manufacturing the semiconductor laser array 1 does not need to carry out a plurality of crystal growth unlike Japanese Patent Application Laid-Open No. 2000-11417. Moreover, space between the waveguides does not require modulation unlike Japanese Patent Application Laid-Open No. 2008-4743, so that the semiconductor laser array 1 of the preferred embodiment is excellent in productivity.

The unnecessity of carrying out the plurality of crystal growth of the semiconductor in the manufacturing process is advantageous for reliability. In other words, the semiconductor laser array 1 of the preferred embodiment includes the active layer made of good-quality semiconductor crystals having less lattice defects, which allows the laser array 1 to drive high output for a long time.

In the semiconductor laser array 1 of the preferred embodiment, the plurality of laser elements have the same structure, and the waveguides of the laser elements are evenly spaced apart from one another. The waveguide of each laser element is disposed with a sufficient distance that does not cause mutual optical interference. Therefore, the semiconductor laser array 1 of the preferred embodiment can prevent an unstable operation which is a problem in the technique to modulate the space between the waveguides to multiplex the wavelengths and is caused by the optical interference between the adjacent laser elements.

The semiconductor laser array 1 of the preferred embodiment can set many conditions only with the adjustment to the reflectance of the front-end-surface reflection films 5 and the front-end-surface reflection films 6, so that the semiconductor laser array 1 can be compatible with various required specifications.

In the semiconductor laser array 1 of the preferred embodiment, the waveguide of each laser element has the same structure, so that each laser element can be driven under the same condition by connecting each electrode to the same power supply. In other words, a complicated drive circuit is not needed, and thus it is advantageous for the mechanism and the cost. Here, the semiconductor laser array 1 can be driven by the single power supply because the waveguide of each laser element has the same structure and the semiconductor laser array 1 can be driven as the "parallel circuit in which the waveguide of each laser element has the same resistance."

In the semiconductor laser array 1 of the preferred embodiment, the plurality of laser elements having the different oscillation wavelengths can be simultaneously driven by the single power supply, so that the semiconductor laser array 1 is also preferably applicable as the light source of the display device. The reason is that the screen is needed to be irradiated with the light beams having the wide spectral width, namely, the light beams multiplexing the wavelengths in order to achieve the speckle noise reduction.

Each laser element of the semiconductor laser array 1 can be configured to be not only a gain-guiding type (for example, broad area laser) having a simple structure but also to be a refractive index-guiding type (for example, ridge type laser and buried hetero laser). In both cases, a plurality of laser elements having the same structure are formed on the same substrate, and thus the plurality of laser elements can be easily driven under the same condition, whereby the effects of the present invention can be fully exhibited.

In the semiconductor laser array 1 of the preferred embodiment, the plurality of laser elements (namely, first to fifth laser elements 20a, 20b, 20c, 20d, 20e) include the first group and the second group, the front-end-surface reflection films 5 of the laser elements (first and second laser elements 20a, 20b) forming the first group have the first reflectance (namely, reflectance $R_5$), the front-end-surface reflection films of the laser elements (third to fifth laser elements 20c, 20d, 20e) forming the second group have the second reflectance (namely, reflectance $R_6$), and the first reflectance is higher than the second reflectance. In a case where an output of the laser elements increases as the reflectance of the front-end-surface reflection films 5, 6 increases, the laser elements forming the first group are fewer than the laser elements forming the second group. In a case where an output of the laser elements decreases as the reflectance of the front-end-surface reflection films 5, 6 increases, the laser elements forming the first group are more than the laser elements forming the second group.

In the preferred embodiment, the front-end-surface reflection films 5 of the laser elements of the first group has the reflectance $R_5$ higher than the reflectance $R_6$ of the front-end-surface reflection films 6 of the laser elements of the second group ($R_5 > R_6$). As shown in FIG. 6, the output of the laser elements in the preferred embodiment increases as the reflectance of the front-end-surface reflection films increases. Therefore, the laser elements (first and second laser elements 20a, 20b) of the first group producing the relatively high output are fewer than the laser elements (third to fifth laser elements 20c, 20d, 20e) of the second group producing the relatively low output. This can reduce the difference in the output between the groups.

In the semiconductor laser array 1 of the preferred embodiment, the plurality of laser elements (namely, first to fifth laser elements 20a, 20b, 20c, 20d, 20e) are formed on the same substrate, and the plurality of laser elements have the same characteristics except for the reflectance of the front-end-surface reflection films 5 and 6.

Therefore, after the plurality of laser elements (namely, first to fifth laser elements 20a, 20b, 20c, 20d, 20e) are formed on the same substrate to manufacture the laser array by the manufacturing method similar to the method for manufacturing the general laser array, the front-end-surface reflection films 5 and the front-end-surface reflection films 6 only have the different reflectances, whereby the semiconductor laser array 1 can easily be obtained.

In the semiconductor laser array 1 of the preferred embodiment, the plurality of laser elements (first to fifth laser elements) are broad area lasers.

Therefore, the laser elements are the broad area lasers which are easily manufactured, and thus the semiconductor laser array 1 can easily be obtained.

Second Preferred Embodiment

Figure 7:
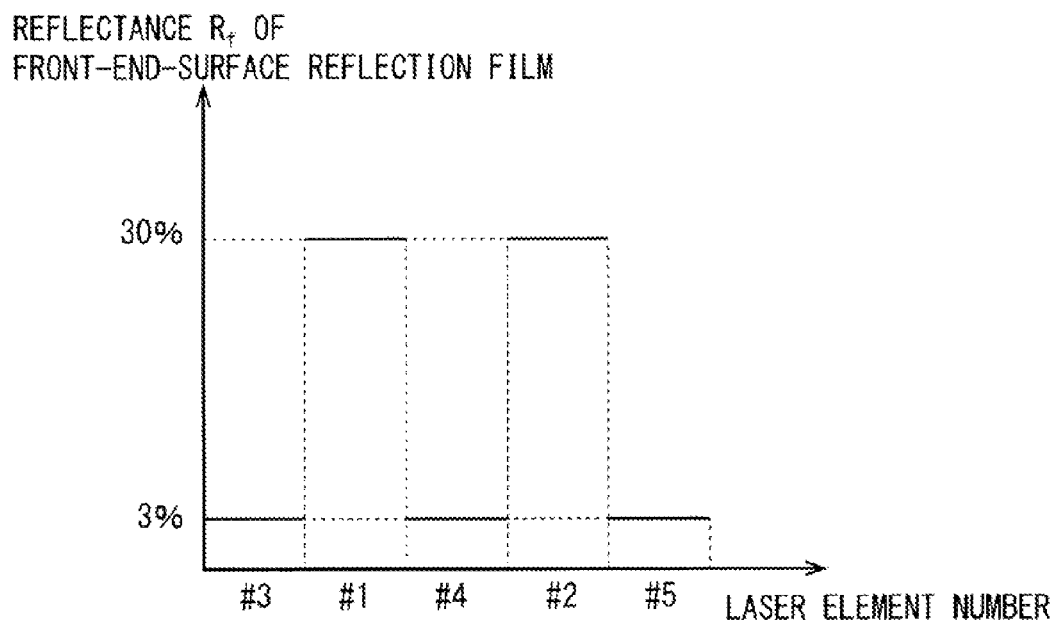
FIG. 7 is a diagram showing a reflectance distribution of front-end-surface reflection films of a semiconductor laser array according to a second preferred embodiment.

FIG. 7 is a diagram showing a reflectance distribution of front-end-surface reflection films of a semiconductor laser array according to this preferred embodiment. In the first preferred embodiment (FIG. 3), the plurality of laser elements are disposed in order of the first, second, third, fourth, and fifth laser elements. On the other hand, in the preferred embodiment, as shown in FIG. 7, a plurality of laser elements are disposed in order of third, first, fourth, second, and fifth laser elements. In other words, the laser elements including the front-end-surface reflection films of the different reflectances are disposed alternately. The configuration except for this is the same as the configuration in the first preferred embodiment, and thus the description will be omitted.

<Effect>

In the semiconductor laser array 1 of the preferred embodiment, the laser elements including the front-end-surface reflection films of the different reflectances are disposed alternately.

Therefore, the laser elements including the front-end-surface reflection films of the different reflectances are disposed alternately, which enables to uniformalize the spatial distribution of the wavelength of the output light beam of the semiconductor laser array 1.

Third Preferred Embodiment

Figure 8:
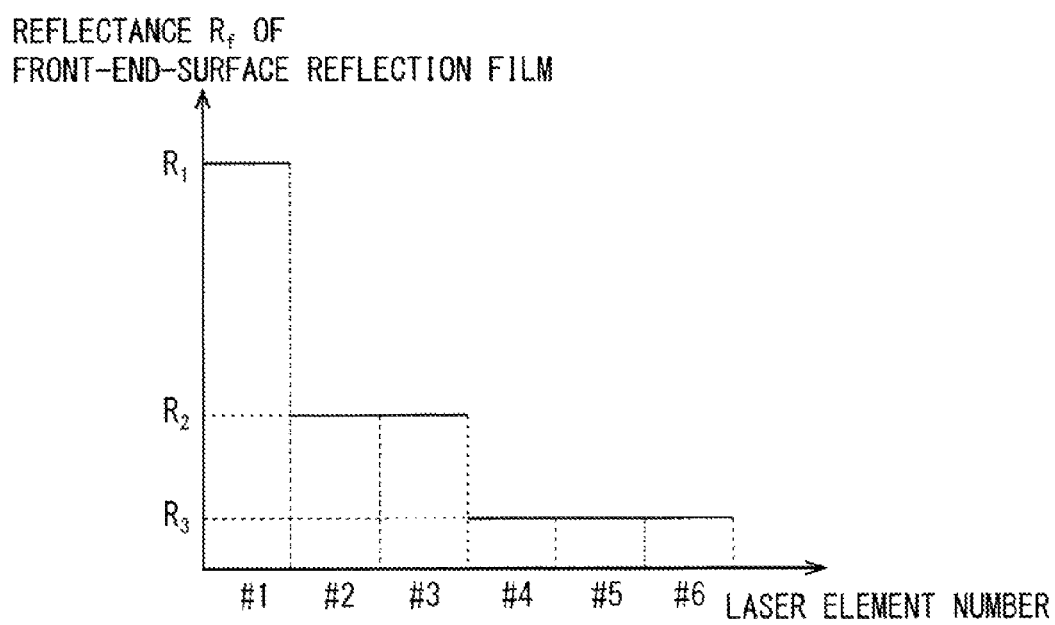
FIG. 8 is a diagram showing a reflectance distribution of front-end-surface reflection films of a semiconductor laser array according to a third preferred embodiment.

FIG. 8 is a diagram showing a reflectance distribution of front-end-surface reflection films of a semiconductor laser array according to this preferred embodiment. In the preferred embodiment, the semiconductor laser array includes first to sixth laser elements. The first to sixth laser elements are disposed such that waveguides of the laser elements are parallel to one another similarly to the first preferred embodiment.

In this preferred embodiment, a front-end-surface reflection film of a first laser element has a reflectance $R_1$. Front-end-surface reflection films of a second and a third laser elements have a reflectance $R_2$. Front-end-surface reflection films of a fourth to sixth laser elements have a reflectance $R_3$. Here, the relationship $R_1 > R_2 > R_3$ holds true. The configuration except for this is the same as the configuration in the first preferred embodiment, and thus the description will be omitted.

In this manner, the plurality of laser elements have the three types of the reflectances of the front-end-surface reflection films, whereby the wavelengths of the semiconductor laser array can be multiplexed by superimposing the three different wavelengths. Thus, the spectral width of the output light beams can be expanded more than that in the first preferred embodiment, allowing for further improvements in the effects of reducing the speckle noise.

In addition, according to the present invention, the above preferred embodiments can be arbitrarily combined, or each preferred embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A monolithic semiconductor laser array including a plurality of laser elements formed on the same substrate, wherein
    said plurality of laser elements are disposed such that waveguides of said laser elements are parallel to one another,
    each of said plurality of laser elements includes a front-end-surface reflection film covers substantially an entire front end surface serving as a light emitting surface of said waveguide,
    each of said front-end-surface reflection films has uniform reflectance in said front-end-surface,
    each of said plurality of laser elements includes a rear-end-surface reflection film on a rear end surface opposite to said front end surface with said waveguide sandwiched between said front end surface and said rear end surface,
    said respective front-end-surface reflection films of a first subset of at least one of said plurality of laser elements has a first reflectance, and said respective front-end-surface reflection films of a second subset of at least one of said plurality of laser elements has a second reflectance different from said first reflectance,
    said rear-end-surface reflection films of said plurality of laser elements have the same reflectance,
    said plurality of laser elements are driven by a single power supply, and
    respective outputs of said first subset of said plurality laser elements are greater than or equal to respective outputs of said second subset of said plurality of laser elements and, if said respective outputs of said first and second subsets are not equal, said first subset will have a fewer number of said plurality of laser elements than said second subset.

2. The semiconductor laser array according to claim 1, wherein
    said plurality of laser elements include a first group and a second group,
    said front-end-surface reflection films of said laser elements forming said first group have said first reflectance,
    said front-end-surface reflection films of said laser elements forming said second group have said second reflectance,
    said first reflectance is higher than said second reflectance,
    in a case where an output of said laser elements increases as the reflectance of said front-end-surface reflection films increases, said laser elements forming said first group are fewer than said laser elements forming said second group, and
    in a case where an output of said laser elements decreases as the reflectance of said front-end-surface reflection films increases, said laser elements forming said first group are more than said laser elements forming said second group.

3. The semiconductor laser array according to claim 2, wherein said plurality of laser elements have the same characteristics except for the reflectances of said front-end-surface reflection films.

4. The semiconductor laser array according to claim 2, wherein said plurality of laser elements are broad area lasers.

5. The semiconductor laser array according to claim 2, wherein said laser elements respectively including said front-end-surface reflection films of different reflectances are disposed alternately.

6. The semiconductor laser array according to claim 1, wherein
said plurality of laser elements have the same characteristics except for the reflectances of said front-end-surface reflection films.

7. The semiconductor laser array according to claim 1, wherein said plurality of laser elements are broad area lasers.

8. The semiconductor laser array according to claim 1, wherein said laser elements respectively including said front-end-surface reflection films of different reflectances are disposed alternately.

* * * * *